(12) United States Patent
Zhuang et al.

(10) Patent No.: US 6,673,691 B2
(45) Date of Patent: Jan. 6, 2004

(54) METHOD FOR RESISTANCE SWITCH USING SHORT ELECTRIC PULSES

(75) Inventors: Wei-Wei Zhuang, Vancouver, WA (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/256,358

(22) Filed: Sep. 26, 2002

(65) Prior Publication Data

US 2003/0156445 A1 Aug. 21, 2003

Related U.S. Application Data

(63) Continuation-in-part of application No. 10/072,225, filed on Feb. 7, 2002.
(51) Int. Cl.[7] .......................... G11C 11/00; H01L 21/00
(52) U.S. Cl. ........................ 438/382; 438/3; 365/148
(58) Field of Search ............................. 438/5, 10, 466, 438/795, 382, 3; 365/148; 427/58

(56) References Cited

U.S. PATENT DOCUMENTS 6,204,139 B1     3/2001  Liu et al.
6,473,332 B1 *  10/2002  Ignatiev et al. ............. 365/148
6,531,371 B2 *   3/2003  Hsu et al. .................... 438/385

OTHER PUBLICATIONS

Liu et al., *Electric-pulse-induced reversible resistance change effect in magnetroresistive films*, Applied Physics Letters, vol. 76, No. 19; May 8, 2000, pp 2749–2751.

* cited by examiner

*Primary Examiner*—Kammand Cuneo
*Assistant Examiner*—Lisa Kilday
(74) *Attorney, Agent, or Firm*—David C. Ripma; Matthew D. Rabdau; Scott C. Krieger

(57) ABSTRACT

A method of changing the resistance of a perovskite metal oxide thin film device with a resistance-change-producing pulse includes changing the resistance of the device by varying the duration of a resistance-change-producing pulse.

9 Claims, 3 Drawing Sheets

METHOD FOR RESISTANCE SWITCH USING SHORT ELECTRIC PULSES

RELATED APPLICATION

This Application is a continuation-in-part of Ser. No. 10/072,225, filed Feb. 7, 2002, for Device and method for reversible resistance change induced by electric pulses in non-crystalline perovskite unipolar programmable memory, which is incorporated herein by reference.

FIELD OF THE INVENTION

This invention relates to non-volatile resistor memory devices, and specifically to a method of reading and writing a non-volatile memory cell using reversible resistance changes.

BACKGROUND OF THE INVENTION

Perovskite metal oxide thin films, such as $Pr_{0.7}Ca_{0.3}MnO_3$ (PCMO) thin films, have reversible resistance change properties, which can be used in non-volatile memory devices for information storage. Known methods to induce the resistance change include application of a short electric pulse for writing and a long electric pulse for resetting, wherein both electric pulses have the same polarity.

PCMO thin films exhibit reversible resistance change when an electric pulse is applied. A PCMO thin film has been grown on both epitaxial $YBa_2Cu_3O_7$ (YBCO) and partial epitaxial platinum substrates via pulsed laser abrasion (PLA) technique, Liu et al., *Electric-pulse-induced reversible resistance change effect in magnetoresistive films*, Applied Physics Letters, 76, 2749, 2000; and Liu et al., U.S. Pat. No. 6,204,139, granted Mar. 20, 2001, for Method of switching the properties of perovskite materials used in thin film resistors. X-Ray diffraction (XRD) polar figures confirm the epitaxial properties of PCMO thin films.

U.S. Pat. No. 6,204,139 describes the resistance change which occurred when electric pulses were applied at room temperature to PCMO thin films. The PCMO thin films were deposited on both epitaxial $YBa_2Cu_3O_7$ (YBCO) and partial epitaxial platinum substrates by pulsed laser deposition (PLD). The polarity of the electric pulse determines the character of the resistance change, i.e., increase or decrease.

An electrically programmable resistance, non-volatile memory device, operable at room temperature, was made of PCMO epitaxially grown on YBCO on $LaAlO_3$, as published by Liu et al, however, the sample size was on the order of one-inch square, which is not practical for commercial production. This type of memory may be reversibly programmed by a reversed short electrical pulse. The memory cell is able to produce either single bit or multi-bit information. However, the PCMO must be in crystalline form, which requires that the PCMO must be grown on a specific bottom electrode, such as YBCO, which is not compatible to the state-of-the-art silicon integrated circuit technology. The growth, or crystallization, temperature is relatively high, e.g., >700° C., which makes integration of the device into state-of-the-art integrated circuit very complex. In addition it is not possible to cover the full circuit area with a single grain of PCMO. As the properties of a memory cell which is fabricated on a single grain PCMO crystal and the properties of a memory cell which is fabricated on a multi-grain PCMO crystal, which covers the grain boundary area, are not the same, circuit yield and memory performance problems will occur. A low ΔR/R ratio was reported for the Liu et al. sample. It is not believed that the Liu et al. technique can be applied to commercially manufactured non-volatile memory devices.

SUMMARY OF THE INVENTION

A method of changing the resistance of a perovskite metal oxide thin film device with a resistance-change-producing pulse includes changing the resistance of the device by varying the polarity of a resistance-change-producing pulse.

It is an object of the invention to provide for the use of a short electric pulse of different polarity to provide reversible resistance of a programmable memory.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

As described in the above-identified related application, Device and method for reversible resistance change induced by electric pulses in non-crystalline perovskite unipolar programmable memory, perovskite metal oxide thin films, such as $Pr_{0.7}Ca_{0.3}MnO_3$ (PCMO) thin films, have reversible resistance change properties, which can be used in non-volatile memory device for information storage. The method of this invention includes inducement of reversible resistance changes through use of electric pulses having different polarities.

The preparation of a PCMO thin films is described in the cited prior art and the related application. Further research has established that the use of short pulses of differing polarity will switch the resistance of a PCMO thin film, which is a different method than that previously described by Liu et al. and in the related application. The method of the invention for forming a PCMO memory device includes depositing a PCMO thin film by spin-coating at a temperature less than 600° C. on a standard six-inch silicon wafer having an integrated platinum or iridium layer. A device constructed according to the method of the invention includes a silicon substrate having a silicon oxide layer on the surface thereof and a first metal layer formed on the silicon oxide. The first metal layer is formed of a metal taken from the group of metals consisting of platinum and iridium. The perovskite metal oxide thin film is formed on the first metal layer to a thickness of between about 50 nm to 500 nm, and includes a crystalline layer. A second metal layer is formed on the perovskite metal oxide, and is taken from the group of metals consisting of platinum and iridium.

To write data, a resistance-change-producing pulse, of either positive or negative polarity, is applied to increase the thin film's resistance. An electric pulse having a voltage in a range of between about 2V to 6V, ±, with a pulse duration time in a range of between about 5 ns to 800 ns is effective to write data to a PCMO memory device constructed according to the method of the invention.

To reset data, a resistance-change-producing pulse is applied to decrease the thin film's resistance. An electric pulse having a voltage in a range of between about 1V to 4V with a pulse duration time in a range of between about 1 µs to 50 ms is effective to reset, or "erase" data stored in the memory.

Figure 1:
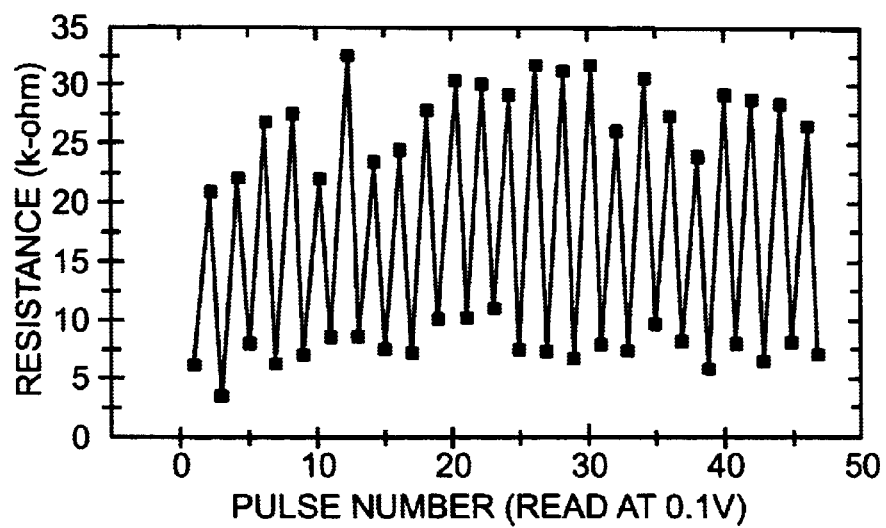
FIG. 1 depicts resistance switching using electric pulses on PCMO thin film.

For example, a PCMO thin film having an integration structure including layers of Pt/PCMO/Pt/Ti/SiO$_2$ on a silicon wafer exhibits reversible resistance switching following application of an electric pulse at +5V for a 100 ns duration for writing and is reset following application of 2.5V and for a 5 µs duration, as shown in FIG. 1. A high ΔR/R ratio is exhibited.

Another example includes three layers of PCMO thin film which are spin-coated on a 6" wafer. The substrate is an integration of Pt(1200 Å)/Ti(500 Å)/SiO2(1000 Å)/wafer. The thickness of PCMO thin film is 1500 Å. Platinum (1000 Å) is used as the top electrode. After post-annealing at 525° C. for 50 minutes in air, the resistance switch properties were measured. In the measurement, each datum was recorded by applying only one pulse. In the study of write process, the resistance was reset to low resistance state by using one reset pulse before applying each short write pulse, and also in the study of reset process, the resistance was written to high resistance state by using one write pulse before applying each one reset pulse.

Figure 2A:
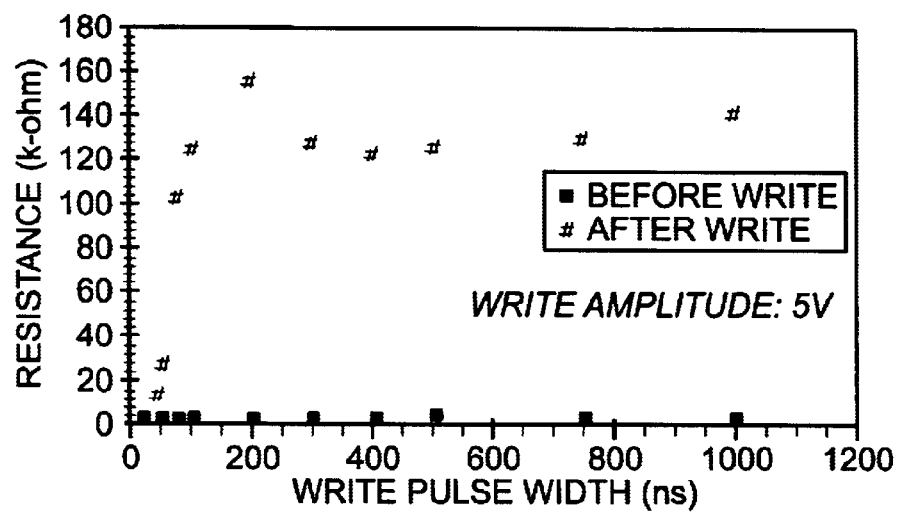
FIG. 2 depicts resistance switching with a 5V write amplitude and 100 ns pulse width.
Figure 2B:
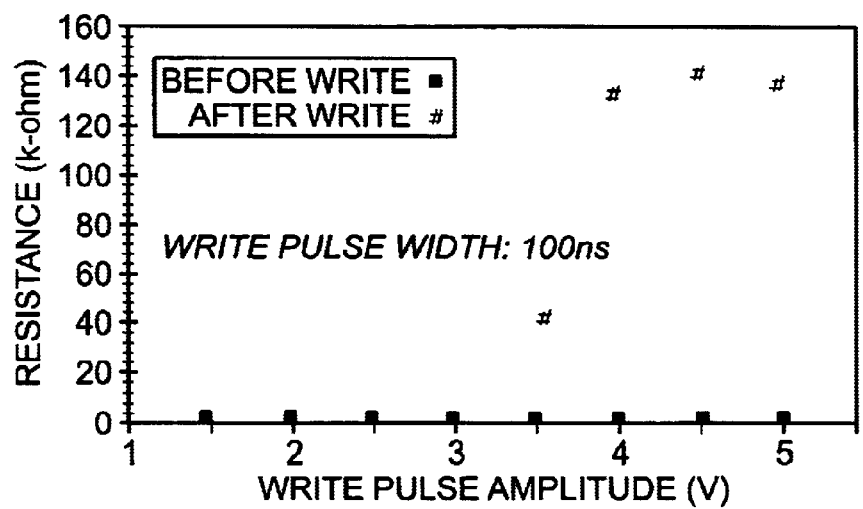

FIG. 2 depicts write process parameters. To study the write pulse width dependence, the write pulse amplitude was set to 5V. As shown in FIG. 2a, the resistance begins to change when the pulse width is about 50 ns, and reaches full scale switch when the pulse width is about 100 ns. In the study of write pulse amplitude dependence, the pulse width is at 100 ns, and, as shown in FIG. 2b, the resistance begins to change when the applied pulse voltage is around 3.5V, and reaches the full scale switch when it is about 4V.

Figure 3A:
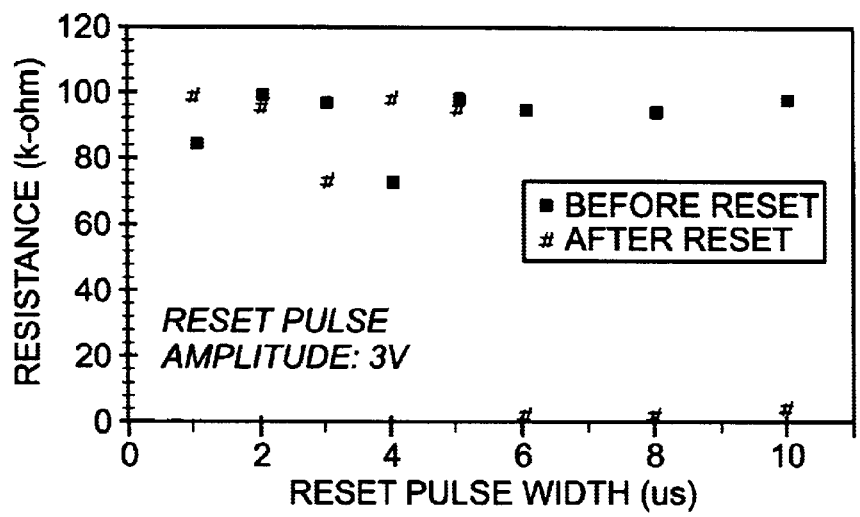
FIG. 3 depicts resistance switching with a 3V reset amplitude and 10 μs pulse width.
Figure 3B:
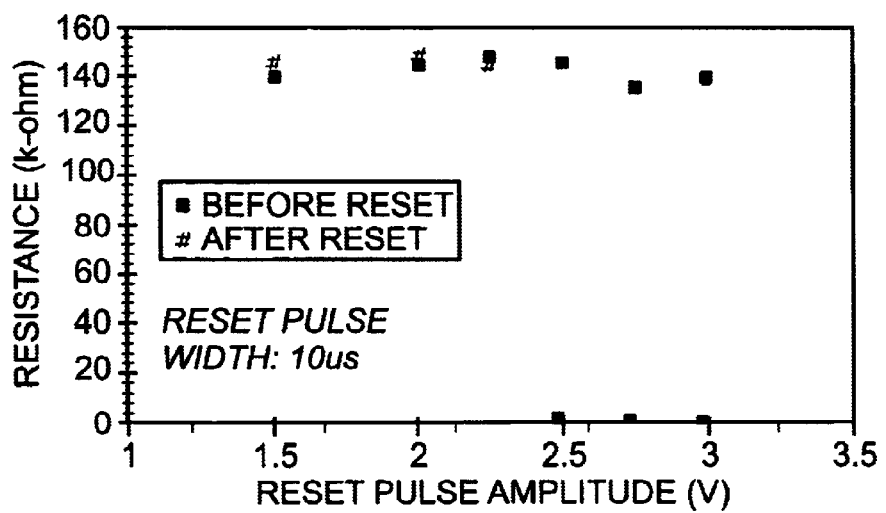

FIG. 3 depicts the reset process parameters, which are similar to the write process parameters with respect to reset pulse width dependence, the pulse amplitude was set at 3V. FIG. 3a demonstrates that the reset begins when the pulse width is about 5 µs. FIG. 3b demonstrates the reset pulse amplitude dependence, which demonstrates that the reset begins when the pulse voltage is about 2.5V if the pulse width is set at 10 µs.

As described in the related application, a positive long duration electric pulse may be used to reset the memory device. The duration of the pulse need to write or reset any specific PCMO thin film will vary, according to the specific properties of the thin film.

Thus, a method for method for resistance switch using short electric pulses has been disclosed. It will be appreciated that further variations and modifications thereof may be made within the scope of the invention as defined in the appended claims.

What is claimed is:

1. A method of changing the resistance of a perovskite metal oxide thin film device with a resistance-change-producing pulse comprising changing the resistance of the device by varying the duration of a resistance-change-producing pulse.

2. The method of claim 1 wherein changing the resistance of the device includes decreasing the resistance of the device by applying a voltage of between about one volt to four volts for a period of between about 1 µsec to 50 ms.

3. The method of claim 1 wherein changing the resistance if the device includes increasing the resistance of the device by applying a voltage of between about two volts to five volts for a period of between about 5 ns to 800 ns.

4. A method of changing the resistance of a perovskite metal oxide thin film device with a resistance-change-producing pulse, wherein the device includes a silicon substrate having a silicon oxide layer on the surface thereof; a first metal layer formed on the silicon oxide, wherein the metal of the first metal layer is taken from the group of metals consisting of platinum and iridium; a perovskite metal oxide thin film formed on the first metal layer to a thickness of between about 50 nm to 500 nm, and which includes a crystalline layer; a second metal layer on the perovskite metal oxide, wherein the metal of the second metal layer is taken from the group of metals consisting of platinum and iridium; comprising:

changing the resistance of the device by varying the duration of a resistance-change-producing pulse.

5. The method of claim 4 wherein changing the resistance of the device includes decreasing the resistance of the device by applying a voltage of between about one volt to four volts for a period of between about 1 µsec to 50 ms.

6. The method of claim 4 wherein changing the resistance if the device includes increasing the resistance of the device by applying a voltage of between about two volts to five volts for a period of between about 5 ns to 800 ns.

7. The method of claim 4 wherein said perovskite metal oxide thin film includes a thin film having a general formula of $M'_x M''_{(1-x)} M_y O_z$, wherein:

M': is taken from the group consisting of La, Ce, Bi, Pr, Nd, Pm, Sm Y, Sc, Yb, Lu, Gd;

M": is taken from the group consisting of Mg, Ca, Sr, Ba, Pb, Zn, Cd;

M: is taken from the group consisting of Mn, Ce, V, Fe, Co, Nb, Ta, Cr, Mo, W, Zr, Hf Ni;

x: has a range of between 0 to 1;

y: has a range of between 0 to 2; and z: has a range of between 1 to 7.

8. A method of changing the resistance of a perovskite metal oxide thin film device with a resistance-change-producing pulse, wherein the device includes a silicon substrate having a silicon oxide layer on the surface thereof; a first metal layer formed on the silicon oxide, wherein the metal of the first metal layer is taken from the group of metals consisting of platinum and iridium; a perovskite metal oxide thin film formed on the first metal layer to a thickness of between about 50 nm to 500 nm, and which includes a crystalline layer; a second metal layer on the perovskite metal oxide, wherein the metal of the second metal layer is taken from the group of metals consisting of platinum and iridium; comprising:

changing the resistance of the device by varying the duration of a resistance-change-producing pulse, which includes decreasing the resistance of the device by applying a voltage of between about one volt to four volts for a period of between about 1 µsec to 50 ms and increasing the resistance of the device by applying a voltage of between about two volts to five volts for a period of between about 5 ns to 800 ns.

9. The method of claim 8 herein said perovskite metal oxide thin film includes a thin film having a general formula of $M'_x M''_{(1-x)} M_y O_z$, wherein:

M': is taken from the group consisting of La, Ce, Bi, Pr, Nd, Pm, Sm Y, Sc, Yb, Lu, Gd;

M": is taken from the group consisting of Mg, Ca, Sr, Ba, Pb, Zn, Cd;

M: is taken from the group consisting of Mn, Ce, V, Fe, Co, Nb, Ta, Cr, Mo, W, Zr, Hf, Ni;

x: has a range of between 0 to 1;

y: has a range of between 0 to 2; and z: has a range of between 1 to 7.

* * * * *